US011640900B2

United States Patent
Kuyel

(10) Patent No.: US 11,640,900 B2
(45) Date of Patent: May 2, 2023

(54) ELECTRON CYCLOTRON ROTATION (ECR)-ENHANCED HOLLOW CATHODE PLASMA SOURCE (HCPS)

(71) Applicant: Nano-Master, Inc., Austin, TX (US)

(72) Inventor: Birol Kuyel, Austin, TX (US)

(73) Assignee: Nano-Master, Inc., Austin, TX (US)

( * ) Notice: Subject to any disclaimer, the term of this patent is extended or adjusted under 35 U.S.C. 154(b) by 322 days.

(21) Appl. No.: 17/162,828

(22) Filed: Jan. 29, 2021

(65) Prior Publication Data
US 2021/0249234 A1    Aug. 12, 2021

Related U.S. Application Data

(60) Provisional application No. 62/975,570, filed on Feb. 12, 2020.

(51) Int. Cl.
*H01J 37/32*    (2006.01)

(52) U.S. Cl.
CPC .... *H01J 37/32678* (2013.01); *H01J 37/3244* (2013.01); *H01J 37/32082* (2013.01); *H01J 37/32596* (2013.01); *H01J 37/32669* (2013.01); *H01J 2237/334* (2013.01); *H01J 2237/3321* (2013.01)

(58) Field of Classification Search
CPC ............... H01J 37/32; H01J 37/32678; H01J 37/32082; H01J 37/3244; H01J 37/32449; H01J 37/32596; H01J 37/32669; H01J 2237/3321; H01J 2237/334
See application file for complete search history.

(56) References Cited

U.S. PATENT DOCUMENTS

| | | | |
|---|---|---|---|
| 4,282,267 A | 8/1981 | Kuyel | |
| 5,332,442 A | 7/1994 | Kubodera et al. | |
| 6,863,021 B2 | 5/2005 | Sneh | |
| 6,916,398 B2 | 7/2005 | Chen et al. | |
| 6,998,014 B2 | 2/2006 | Chen et al. | |
| 7,138,336 B2 | 11/2006 | Lee et al. | |
| 7,314,835 B2 | 1/2008 | Ishizaka et al. | |

(Continued)

OTHER PUBLICATIONS

Beneq, "Advanced tool for advanced ALD research: Thin Film System—TFS 200", Beneq, Jul. 1, 2009, 28 pgs.

(Continued)

*Primary Examiner* — Thai Pham
(74) *Attorney, Agent, or Firm* — Asif Ghias

(57) ABSTRACT

Techniques are disclosed for an electron cyclotron rotation (ECR)-enhanced hollow cathode plasma source (HCPS). A cylindrical magnet is placed around the neck of a hollow cathode under the influence of an RF field. A plasma gas is introduced in the hollow cathode that undergoes phase transition to a plasma containing free electrons and gas ions. The magnetic field of the magnet causes ECR that confines free electrons to a narrow spiraling beam traveling down the body of the hollow cathode. Unlike traditional methods, the present ECR-enhanced design confines the electrons and ions to a narrow path away from the walls of the cathode. The high-density, stable plasma is available at the distal end of the hollow cathode. A multicavity design utilizes multiple cavities with multiple aligned magnets in a single reactor suitable for various processes including, PECVD, PEALD, ALE, etc.

20 Claims, 7 Drawing Sheets

(56) References Cited

U.S. PATENT DOCUMENTS

| | | | |
|---|---|---|---|
| 7,341,959 B2 | 3/2008 | Brcka | |
| 7,780,785 B2* | 8/2010 | Chen | C23C 16/45525 |
| | | | 156/345.33 |
| 7,966,969 B2 | 6/2011 | Hasper et al. | |
| 8,187,679 B2 | 5/2012 | Dickey et al. | |
| 8,637,411 B2 | 1/2014 | Swaminathan et al. | |
| 8,728,955 B2 | 5/2014 | LaVoie et al. | |
| 8,940,646 B1 | 1/2015 | Chandrasekharan et al. | |
| 9,343,296 B2 | 5/2016 | LaVoie | |
| 9,972,501 B1* | 5/2018 | Kuyel | C23C 16/50 |
| 11,087,959 B2* | 8/2021 | Kuyel | H01J 37/32724 |
| 2002/0129769 A1 | 9/2002 | Kim et al. | |
| 2008/0110400 A1 | 5/2008 | Satou et al. | |
| 2011/0003087 A1 | 1/2011 | Soininen et al. | |
| 2012/0141676 A1 | 6/2012 | Sershen et al. | |
| 2012/0269968 A1* | 10/2012 | Rayner, Jr. | H01J 37/32449 |
| | | | 118/728 |
| 2013/0251916 A1 | 9/2013 | Krueger et al. | |
| 2014/0216337 A1 | 8/2014 | Swaminathan et al. | |
| 2014/0366804 A1 | 12/2014 | Pak et al. | |
| 2015/0167167 A1 | 6/2015 | Vermeer et al. | |
| 2015/0376785 A1 | 12/2015 | Knaapen et al. | |
| 2016/0052655 A1 | 2/2016 | Nguyen et al. | |
| 2016/0079056 A1 | 3/2016 | Harada et al. | |
| 2016/0312360 A1 | 10/2016 | Rasheed et al. | |
| 2017/0002463 A1 | 1/2017 | Fan et al. | |
| 2017/0016114 A1 | 1/2017 | Becker et al. | |
| 2018/0025892 A1 | 1/2018 | Biquet et al. | |

OTHER PUBLICATIONS

Dimitrakellis et al., "Development of a hollow cathode plasma source for microcrystalline silicon thin films deposition", Journal Of Physics, 11th European Conference on High-Technology Plasma Processes, Apr. 18, 2011, pp. 012014, vol. 275, IOP Publishing, Bristol, UK.

Fietzke et al., "Magnetically enhanced hollow cathode—a new plasma source for high-rate deposition processes", Plasma Processes and Polymers, Nov. 20, 2009, pp. S242-S246, vol. 6, Wiley-VCH Verlag GmbH & Co. KGaA, Weinheim, Germany.

Han, "Physical Processes In Hollow Cathode Discharge", Theses, Master of Science in Physics, Dec. 1, 1989, pp. 1-61, Naval Postgraduate School, Monterey, CA, USA.

Hossbach, C. et al., "Overview of ALD equipment and technologies", ALD for Industry 2017, EFDS Workshop, Institute of Semiconductors and Microsystems—Technical University of Dresden, Jan. 17, 2017, 47 pgs.

Kaariainen, Tommi O. et al., "Plasma-Assisted Atomic Layer Deposition of Al2O3 at Room Temperature", Plasma Processes and Polymers, Wiley Inter-Science, Jun. 2009, pp. 237-241.

Standing, A.J., "Nanowire solar water splitting", Technische Universiteit Eindhoven, Thesis—Applied Physics, Jan. 6, 2016, 170 pgs.

* cited by examiner

ELECTRON CYCLOTRON ROTATION (ECR)-ENHANCED HOLLOW CATHODE PLASMA SOURCE (HCPS)

CROSS-REFERENCE TO RELATED APPLICATIONS

This application claims priority from U.S. Provisional Patent Application No. 62/975,570 filed on Feb. 12, 2020 and which is incorporated by reference herein for all purposes in its entirety. This application is related to U.S. application Ser. No. 16/738,240 filed on Jan. 9, 2020 and which is also incorporated by reference herein for all purposes in its entirety.

This application is further related to U.S. patent application Ser. No. 15/950,330 filed on 11 Apr. 2018, now U.S. Pat. No. 10,366,898 B2 issued on Jul. 30, 2019. This application is also related to U.S. patent application Ser. No. 15/950,391 also filed on 11 Apr. 2018, now U.S. Pat. No. 10,361,088 B2 issued on Jul. 23, 2019. This application is also related to U.S. patent application Ser. No. 15/458,642, now U.S. Pat. No. 9,972,501 B1 issued on 15 May 2018.

FIELD OF THE INVENTION

This invention relates generally to hollow cathode plasma sources (HCPS), and more specifically to electron cyclotron rotation-enhanced HCPS.

BACKGROUND OF THE INVENTION

For semiconductor manufacturing, numerous techniques exist for creating plasma such as capacitively coupled plasma (CCP) systems, inductively coupled plasma (ICP) systems, slotted plane antenna (SPA) plasma systems, etc. Plasma is formed due to the interaction of process gas(es) with electro-magnetic (EM) field propagation at frequencies in the radio frequency (RF) or microwave spectrum.

Of special interest to this disclosure are hollow cathode plasma sources (HCPS). These sources have shown advantages over other traditional plasma sources for depositing films by processes including plasma enhanced chemical vapor deposition (PECVD) and plasma enhanced atomic layer deposition (PEALD/PAALD). Such a traditional HCPS design of the prior art is depicted in FIG. 1.

In the prior art HCPS system 10 of FIG. 1, a plasma gas 12, such as Argon (Ar), is passed through a hollow tube 18 that acts as a cathode. An RF-power, typically greater than 100 W is applied to hollow cathode 18 from an RF-power source 16. Under the influence of the electromagnetic field resulting on the inside of cathode 16 due to RF-source 16, plasma gas 12 is ionized. The electrons thus liberated collide with the walls of the cathode tube in a zig-zag manner or what is referred to as a "pendulum effect". One such electron 14 is schematically shown in FIG. 1.

Through these collisions, these electrons heat tube 18 sufficiently to liberate more electrons from it via field-enhanced thermionic emission. The resulting electrons and the ionized process gas from this self-sustaining process create a high-density plasma 20 at the far end of cathode tube 18. The plasma may then be utilized for deposition of other gas species on semiconductor wafer via processes such as PECVD or PEALD.

But such a traditional HCPS design exhibits several shortcomings including the following. The pressure of resulting plasma 20 needs to be too high for certain applications. Specifically, the pressure cannot be lower than 0.1 Torr in the traditional design of FIG. 1. Due to the intense pendulum effect of the electrons, positive gas ions that follow the electrons bombard the walls of tube 18. This results in atoms from the wall being removed in a process called sputtering. Excessive sputtering contaminates cathode 18 that must be periodically cleaned. Furthermore, the electrons are also lost to the walls of tube 18 thereby reducing the density of plasma 20. Plasma 20 is also not very uniform and stable across the cathode. RF-power source 16 as a result experiences fluctuating load making it harder for a stable operation.

OBJECTS OF THE INVENTION

In view of the shortcomings of the prior art, it is an object of the invention to provide a hollow cathode plasma source (HCPS) that can generate plasma under extremely low pressures. The present design accomplishes this through its innovative use of electron cyclotron rotation (ECR)-enhanced design of the HCPS.

It is thus also an object of the present ECR-enhanced HCPS design to generate high-density plasma with minimal sputtering.

It is also an object of the present ECR-enhanced HCPS design to minimize loss of free electrons to the walls of the hollow cathode.

It is further an object of the present ECR-enhanced HCPS technology to produce a very stable and uniform high-density plasma.

It is further an object of the present design to allow for a very stable load on the RF power source, thus allowing for smooth and stable operation.

Still other objects and advantages of the invention will become apparent upon reading the detailed description in conjunction with the drawing figures.

SUMMARY

The objects and advantages of the present technology are secured by methods and apparatus or systems for an electron cyclotron rotation (ECR)-enhanced hollow cathode plasma source (HCPS). According to the chief aspects, an axially magnetized cylindrical magnet is placed around the neck of a hollow cathode or cavity.

The hollow cathode or cavity is under the influence of a radio frequency electromagnetic field, or simply an RF field.

A gas, referred to as the plasma gas, is flown through the neck of the cavity and into the cavity. Under the influence of the RF field the plasma gas undergoes a state transition to a plasma state or simply plasma. The plasma consists of a free electrons and gas ions. As a key innovative aspect of the present design utilizing the cylindrical magnet, the free electrons thus generated remain confined to a narrow spiraling beam as they travel downward through the body of the hollow cathode/cavity.

This is due to the magnetic field of the cylindrical magnet placed around the neck or the top portion of the cavity where the plasma is stuck. More specifically, it is due to the familiar phenomenon of electron cyclotron rotation (ECR). In other words, as a result of the ECR caused by the magnetic field of the magnet, the electrons spiral down the hollow cathode, instead of undergoing a wild, zig-zag motion or the "pendulum effect" of the techniques of the prior art. Subsequently, the high-density and uniform plasma is produced or outputted or is available at the bottom or far or distal end of the hollow cathode or cavity.

The preferred embodiment utilizes multiple arrangements of the above hollow cathode/cavities in a multicavity design or reactor or chamber. Cylindrical, axial magnets around the tops/necks of the cavities are all oriented in the same direction or are aligned in such an embodiment. The high-density and uniform and stable plasma produced by the multiple cavities is transmitted through mating interfaces via output holes of a showerhead, and into a process volume. The reactant gas(es) are also passed via a trap volume and then through pinholes of the showerhead into the same process volume. It is the process volume where the reactant gas(es) and the plasma first interact.

The above design allows for high-density and stable/uniform plasma to be generated at low pressures. Variety of embodiments of the design utilize varying substrate temperatures and operating pressures. Variations further utilize varying ion energies by controlling RF-bias of the platen holding the substrate. Consequently, embodiments of the present multicavity ECR-enhanced HCPS based design may be used to perform a variety of vacuum deposition processes/operations, including plasma enhanced chemical vapor deposition (PECVD), plasma enhanced/assisted atomic layer deposition (PEALD/PAALD), atomic layer etching (ALE), etc.

Preferably, the frequency of the RF field is substantially 13.56 Megahertz to be compatible with commercial technologies. Preferably, the power of the RF field is greater than 100 Watts. Preferably, the shape of each hollow cathode is like a bottle with a neck, a shoulder and a body. In other words, preferably the hollow cathode is bottle-shaped, although that is not a requirement. Preferably, the magnets are cooled using an innovative arrangement of a thermally conductive ceramic plate, a cooling plate and an inflow/outflow of cooling water.

Clearly, the system and methods of the invention find many advantageous embodiments. The details of the invention, including its preferred embodiments, are presented in the below detailed description with reference to the appended drawing figures.

BRIEF DESCRIPTION OF THE DRAWING FIGURES

DETAILED DESCRIPTION

The figures and the following description relate to preferred embodiments of the present invention by way of illustration only. It should be noted that from the following discussion, alternative embodiments of the structures and methods disclosed herein will be readily recognized as viable alternatives that may be employed without departing from the principles of the claimed invention.

Reference will now be made in detail to several embodiments of the present invention(s), examples of which are illustrated in the accompanying figures. It is noted that wherever practicable, similar or like reference numbers may be used in the figures and may indicate similar or like functionality. The figures depict embodiments of the present invention for purposes of illustration only. One skilled in the art will readily recognize from the following description that alternative embodiments of the structures and methods illustrated herein may be employed without departing from the principles of the invention described herein.

Electron Cyclotron Rotation (ECR)-Enhanced Hollow Cathode Plasma Source (HCPS)

Figure 1:
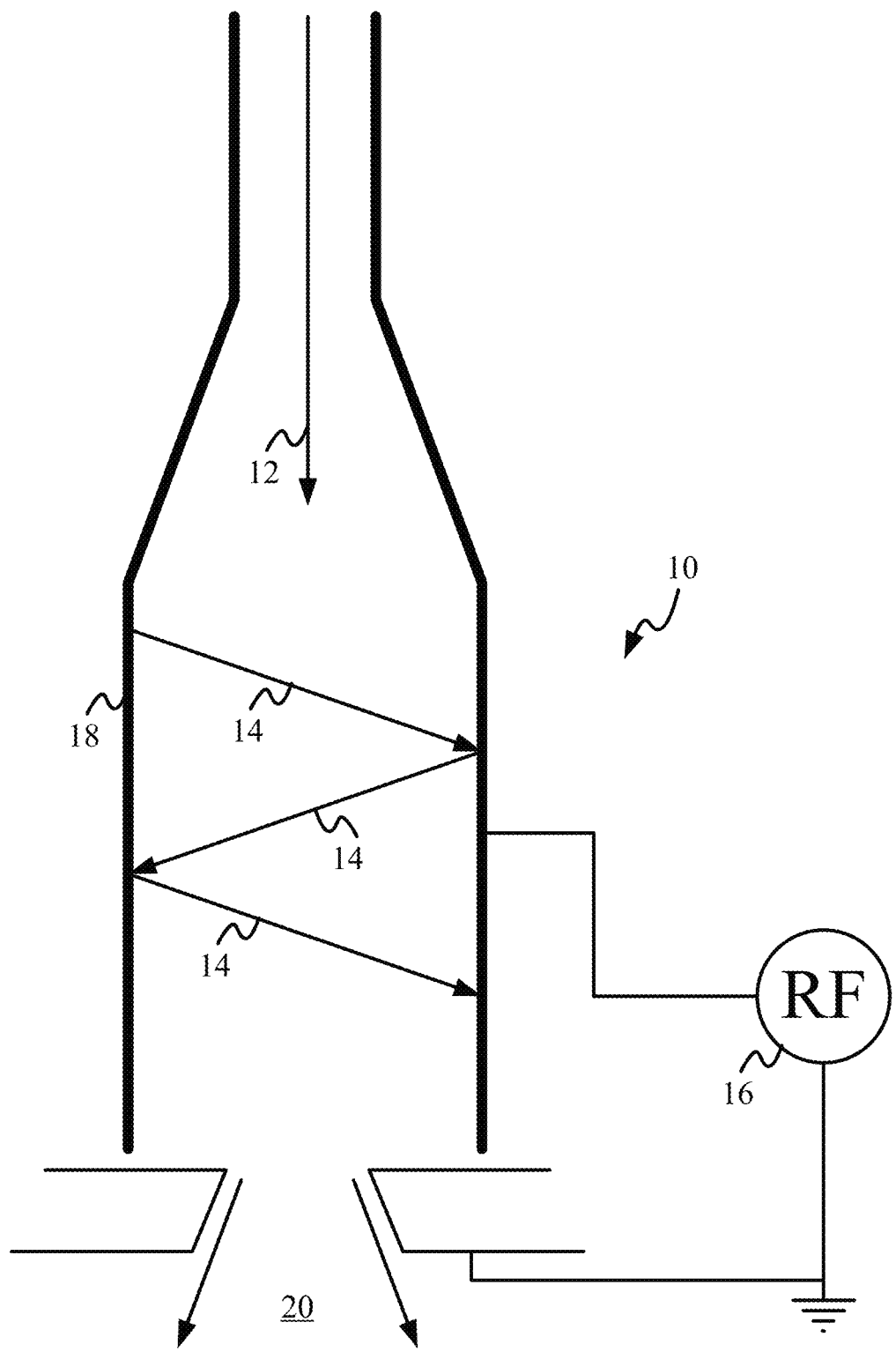
FIG. 1 is a schematic diagram illustrating the traditional HCPS design of the prior art.
Figure 2:
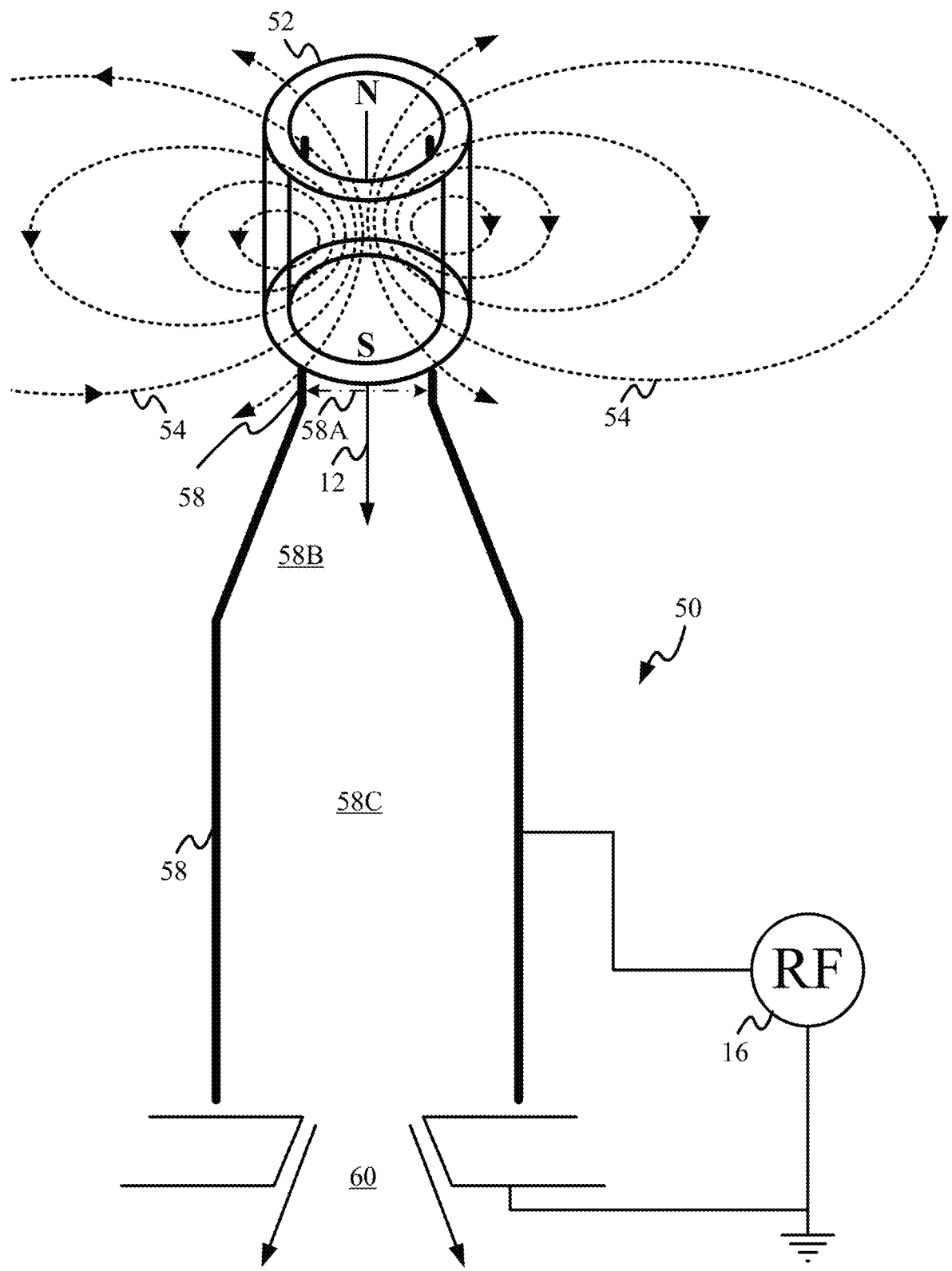
FIG. 2 is a schematic diagram illustrating the Electron Cyclotron Rotation (ECR)-enhanced HCPS design based on the instant principles.

The present invention will be best understood by first reviewing the schematic diagram of the ECR-enhanced HCPS design based on present principles as illustrated in FIG. 2. FIG. 2 shows an instant ECR-enhanced HCPS 50 that is an improvement over the prior art design 10 of FIG. 1 discussed earlier in the Background section. A key innovation of the instant design of ECR-enhanced HCPS 50 of FIG. 2 over traditional HCPS 10 of FIG. 1 is the use of a cylindrical magnet 52 around the neck of a hollow cavity or cathode 58. While the embodiment of FIG. 1 shows one such cavity/cathode 58 with one magnet 52, there may be multiple such arrangements as will be taught later.

As shown, cathode 58 is bottle-shaped with a body 58C, a shoulder 58B, and a neck 58A indicated by the dotted-and-dashed line. Note, that neck 58A is narrower than body 58C with an intervening shoulder 58B. However, that is not a requirement. In other words, in certain embodiments, cavity 58 may not have a distinct narrower neck. In other words, neck 58A may have the same diameter as body 58C. Still differently put, cavity 58 may be cylindrical. Alternatively, there may be a narrower neck 58A but without shoulder 58B. In still other embodiments, the neck may be wider than the body, etc.

There is an RF-power source 16 providing an RF electromagnetic field in the radio frequency (RF) spectrum, referred to herein as RF field, to cathode 58 as shown. Preferably, the electrical power provided to the RF field, referred to herein as the RF-power, is greater than 100 Watts (W). Now, a gas 12, such as Argon (Ar), is flown through hollow cathode or cavity 58 as shown by the arrow. Under the influence of the RF field from RF-power source/supply 16, the gas is ionized inside of cathode or cavity 58, undergoing a phase transition to a plasma state or simply plasma containing free electrons and gas ions. Since gas 12 is used to produce plasma, it may be referred to as the plasma gas with the knowledge that plasma is generated/struck from gas 12 only after it undergoes the phase transition to plasma state inside cavity 58.

Now, because of the instant innovative design of using cylindrical magnet 52 around the neck of cavity 58 where plasma is struck, the resulting electrons are confined to a narrow beam. This is a significant innovation over the prior art design of FIG. 1 where electrons undergo a zig-zag motion striking the walls of the cathode. Consequently, in FIG. 1, the heavy positive gas ions attracted to the electrons (as the plasma tries to maintain neutrality), also bombard the walls of the cathode. As a result, in the prior art design of FIG. 1, sputtering occurs from the walls of the tube/cathode as well as loss of electrons to the walls, thereby reducing the plasma density.

In the contrasting design of present hollow cathode 58, electrons resulting from plasma generation, along with the gas ions of the plasma, are confined to a narrower beam inside the cathode tube. This significantly minimizes sputtering and the loss of electrons to the walls of the cathode, as compared to the traditional techniques.

The electrons are confined in the instant design as depicted in FIG. 2 due to the magnetic field of cylindrical magnet 52 per above. More specifically, the electrons are confined due to the magnetic field lines 54 of magnet 52. Cylindrical magnet 52 is axially magnetized as shown by its North (N) and South (S) poles. Preferably, it is a Neodymium magnet. Preferably, the maximum strength $B_{max}$ of magnetic field 54 is 13,200 Gauss. Preferably, the outside and inside diameters of cylindrical magnet 52 are 0.75 inches and 0.25 inches respectively. Magnetic field 54 is present circumferentially around the part of cathode 58 where plasma is struck/generated, ensuring that electrons are confined to a more narrowly focused path down cathode 58 as compared to the techniques of the prior art.

This innovation of the present design is due to the phenomenon referred to as electron cyclotron rotation (ECR). More specifically, ECR occurs when the frequency of incident radiation coincides with the natural frequency of rotation of electrons in a magnetic field, such as magnetic field 54 of magnet 52. As a result of ECR, free electrons in static and uniform magnetic field 54 move in a circle due to the Lorentz force. As a result, the electrons spiral down, or travel in a narrow/confined spiraling beam, down instant cathode cavity 58 and specifically its body 58C shown in FIG. 2. Subsequently, a very stable and high-density plasma 60 is produced or outputted or is available at the far or distal end of cathode 58 as shown.

High-density plasma 60 of the instant ECR-enhanced HCPS design of FIG. 2 has several advantages over plasma 20 generated by traditional HCPS designs as will be taught further below. But first, let us understand a highly preferred embodiment of the present ECR-enhanced HCPS design employing multiple hollow cathodes and cylindrical magnets. For this purpose, let us take advantage of FIG. 3.

Figure 3:
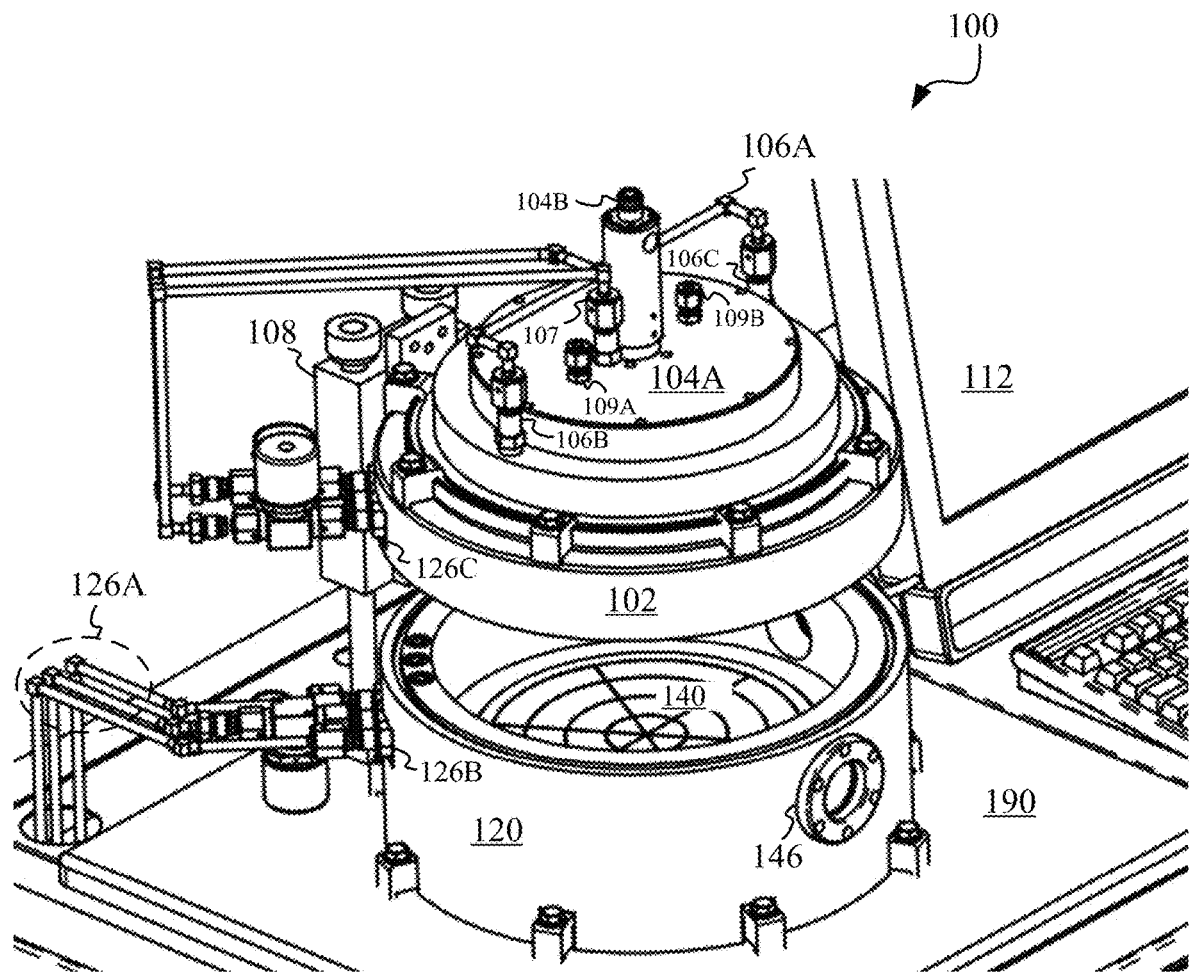
FIG. 3 shows a chamber assembly utilizing an ECR-enhanced HCPS based on the instant principles.

FIG. 3 shows a chamber assembly or simply a chamber 100 utilizing an ECR-enhanced HCPS based on the instant principles. As provided in this disclosure, an ECR-enhanced HCPS based chamber, such as chamber 100, supports both PECVD, PEALD and other forms of deposition/etching processes. However, special attention in the immediate teachings will be given to PECVD process requiring high-density and uniform plasma generated by the instant ECR-enhanced HCPS design.

FIG. 3 shows a perspective view of chamber 100. In the preferred embodiment, chamber 100 of the instant design comprises an upper or top section or portion 102 and a lower or bottom section or portion 120. There is a substrate/wafer surface or a substrate/wafer sample or simply a substrate or a wafer or a sample 140 in lower portion 120 on which deposition or coating by PECVD is performed. Typically, the substrate is a silicon substrate. Sometimes the immediate volume inside chamber 100 surrounding the substrate is also referred to as the process volume. Of course, the process volume exists once top and bottom sections 102 and 120 respectively of chamber 100 are closed. Substrate 140 is placed on top of a rotating and heated platen (not shown). The platen is located on the inside of the process volume below the showerhead as will be explained further below.

FIG. 3 is the chamber assembly taught in detail in incorporated by reference herein, U.S. application Ser. No. 16/738,240 filed on Jan. 9, 2020 to Birol, except with some very important differences. The first difference is that instead of a planar inductively coupled plasma (ICP) source, it is an instant ECR-enhanced hollow cathode plasma source (HCPS) 104A contained in the top portion 102 of chamber assembly 100. The second difference is that there is no grounding metal plate of the ICP-based design of the above-mentioned reference. This is because such a ground plate would unacceptably extinguish the high-density plasma generated by instant HCPS 104A. The third difference is that there is no RF port that provides RF power to the above grounding metal plate. That is because instead of the metal plate acting as an RF source for PECVD, it is HCPS 104A that is utilized for as the plasma source for PECVD in the present design.

Now, HCPS 104A of FIG. 3 has a ducting or tubing or line 106A to carry process gas(es) to the showerhead of the below teachings at two laterally opposite gas feedthrough points 106B and 106C as shown. There is also a plasma gas input 107 to feed plasma gas to HCPS 104A. There is also an RF power feed-through or input 104B providing RF-power to HCPS 104A, and specifically its RF cathode per below teachings. The RF-power source is not explicitly shown in FIG. 3 to avoid distraction from the main principles being taught.

The preferred embodiment of FIG. 3 also shows a chamber lift 108 and a base plate 190 on which chamber or chamber assembly 100 is mounted. Further shown are ducting/lines 126A required to carry the process gas(es) to chamber 100. It should be noted that in FIG. 3, top portion 102 and bottom portion 120 of chamber 100 are shown ajar to delineate their components on the inside. Of course, the deposition process is carried out once the two portions/sections are closed together with a snug and airtight fit to seal chamber 100. This is accomplished by utilizing O-rings per the teachings already provided in the above-mentioned reference, and which are not repeated here for brevity. We may refer to the sealed state of chamber 100 as a substantially sealed state in order to represent the range of vacuum conditions required to carry out the operation of the system. The vacuum conditions are preferably obtained by a combination of backing and turbomolecular pumps.

The gases flowing via lines 126A from lower portion 120 to upper portion 102 may include reactant gases, plasma gasses, purge gases, or other types of gases as required for a given application or process recipe. The gases flow through stainless steel gas lines 126A around which O-rings are provided where upper portion 102 and lower portion 120 close together. The above mechanism allows top and bottom portions 102, 120 respectively to separate from each other without requiring flexible tubing to bring gasses to top portion 102. As a result, top chamber 102 can be pneumatically lifted (manually or otherwise) using chamber lift 108 while still allowing gases to flow from bottom portion 120 to top portion 102 when the two portions are in a closed position. As will be appreciated by those skilled in the art, that the use of stainless-steel lines of the above design provides for a higher reliability than flexible tubing, and the pneumatic lift design provides for a user-friendly system operation.

FIG. 3 also explicitly shows a process computer 112 that runs the control software for managing/controlling the processes or recipes executed in chamber 100. Further shown are two water inlet/outlet ports 109A and 109B that are used to flow cooling water. The water cools a cooling plate (not shown in FIG. 3) that in turn is used to cool the cylindrical magnets that get hot due to the plasma during the operation of the system per below teachings. Conveniently, a plasma viewport 146 is also provided in the system as shown to visually monitor the plasma during system operation as needed.

Figure 4:
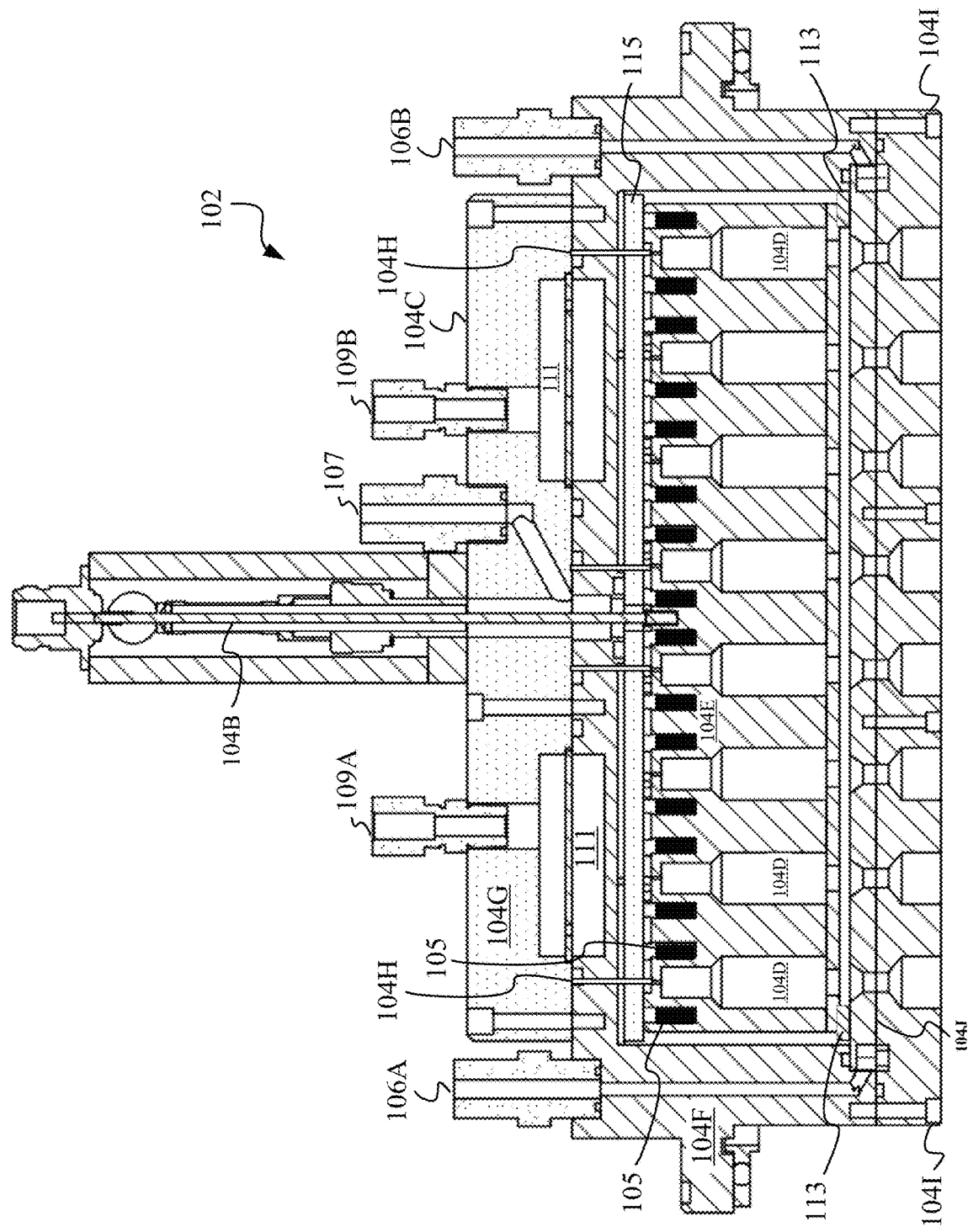
FIG. 4 is a detailed cross-sectional view of the upper section/portion of the chamber assembly of FIG. 3 comprising the instant ECR-enhanced HCPS.

After having learned the overall design of the multi-cavity chamber utilizing the instant ECR-enhanced HCPS in conjunction with the teachings already available in the above-referenced U.S. application Ser. No. 16/738,240 filed on Jan. 9, 2020 to Birol, let us now pay special attention to the design of the ECR-enhanced HCPS itself. For this purpose, let us take advantage of FIG. 4. FIG. 4 shows a detailed cross-sectional view of upper portion 102 of chamber assembly 100 of FIG. 3 containing our ECR-enhanced HCPS 104C. As already mentioned, RF-power feed 104B provides RF-power to HCPS 104A.

Explained further, RF-power feed 104B is used to carry and establish RF field around hollow cathode cavities 104D shown in FIG. 4. For simplicity, we may sometimes refer to RF-feed 104B as RF-power, with the knowledge that it is the RF-power source/supply (not shown) that actually generates the RF field carried by feed 104B. The frequency of the RF field is preferably kept at or near 13.56 Megahertz to be compatible with commercial equipment. As shown, cavities 104D have a bottle shape, with a body, a shoulder and a neck narrower than the body as in the embodiment of FIG. 2. However, similar to the embodiment of FIG. 2, that is not a requirement. The necks, shoulders and bodies of cavities 104D are not marked explicitly in order to avoid clutter in FIG. 2.

Also, not all the cavities are marked by reference numerals for reasons of clarity. In the instant design, the compartment marked by reference numeral 104E may be referred to as the RF cathode of the present multi-cavity ECR-enhanced HCPS embodiment. It is where electromagnetic radiation/energy of the RF field is imparted to intervening cavities 104D under the influence of RF-power 104B. Preferably, bottle-shaped cavities 104D are made out of aluminum because of its high thermal and electrical conductivity.

FIG. 4 also shows cylindrical magnets 105 of the above teachings around the top portions or necks of each instant hollow cathode/cavity 104D as shown. Cylindrical magnets 105 are axially magnetized per above teachings of FIG. 2 and are all oriented in the same direction. We refer to magnets 105 being oriented in the same direction as being aligned in the present disclosure. In other words, by aligned we mean that the north pole (N) or conversely the south pole (S) of all the magnets is either facing up or down. Of course, for the embodiment of FIG. 2, single magnet 52 will be considered aligned whether its north pole (N) or conversely south pole (S) is facing up or down.

Note that due to the cross-sectional view of magnets 105 around cavities 104D shown in FIG. 4, each cylindrical magnet 105 appears as two dark bars or portions around the neck of cavities 104D. It is understood that, each pair of left and right dark portions around the neck of each cavity 104D represents a cylindrical magnet 105 that wraps around circumferentially around the cavity neck. Note, the left and right portions of only one such magnet are shown marked in FIG. 4 by reference numerals 105 in order to avoid clutter.

Referring to FIG. 3, once chamber 100 is sealed, a plasma gas such as argon (Ar), ammonia (NH3), oxygen (O2), nitrogen (N2) or a mixture of one or more thereof, etc., is flown through gas feed 107. The plasma gas flows into volume 104G via gas feed 107. From there, it seeps into cavities 104D via respective pinholes 104H. Pinholes 104H connect volume 104G to cavities 104D passing through housing 104F and ceramic plate 115 further discussed below. Note, only four such pinholes 104H are shown in FIG. 4 connecting into respective cavities 104D and only two such pinholes are explicitly marked by reference numerals 104H in order to avoid clutter.

Plasma is struck in each of hollow cathode cavities 104D under the influence of the RF field due to RF-power 104B. Now, due to the instant innovative design of using cylindrical and aligned magnets 105 around each hollow cathode cavity 104D, the electrons generated due the plasma are confined to a narrow beam due to the phenomenon of ECR per above teachings. As a result, the high-density plasma produced/generated or is available at the far or distal or bottom ends of cavities 104D is a lot more stable, at a lot more desirably low pressures and with minimal sputtering on the walls of the cavities than the techniques of the prior art.

Other advantages of the instant plasma generated by the above ECR-enhanced HCPS design will be enumerated further below. Note that while it is understood that the plasma gas undergoes phase transition to the plasma state inside cavities 104D, we refer to the generation or production or the outputting of plasma only once it arrives at the bottom or distal ends of cavities 104.

FIG. 4 further shows a water inlet port 109A and a water outlet port 109B (or vice versa). Also shown is a cooling plate 111. Cooling plate 111 is a cylindrical plate that wraps around the axis of chamber 102 in a circumferential manner. When cooling water is circulated on top of cooling plate 111 via ports 109A/109B, it draws heat away from magnets 105. Otherwise, magnets 105 may get too hot from plasma generated in cavities 104D, causing risk to the integrity of the system.

Also shown in FIG. 4 is a circular ceramic ring or spacer 113 with a reverse hatched pattern that is meant to electrically isolate RF cathode 104E with its numerous hollow cathode cavities 104D from the housing or body 104F of instant ECR-enhanced HCPS 104C. Housing/body 104F is electrically grounded. Further shown is a circular ceramic plate 115 that is meant to provide RF isolation to housing 104F from RF cathode 104E which is under the influenced of the RF field due to RF-power 104B per above. Ceramic plate 115 must also be thermally conducting/conductive in order to transmit heat away from RF cathode 104E and its magnets 105 to cooling plate 111 from where it is transported away by cooling water via ports 109A-B per above.

Figure 5:
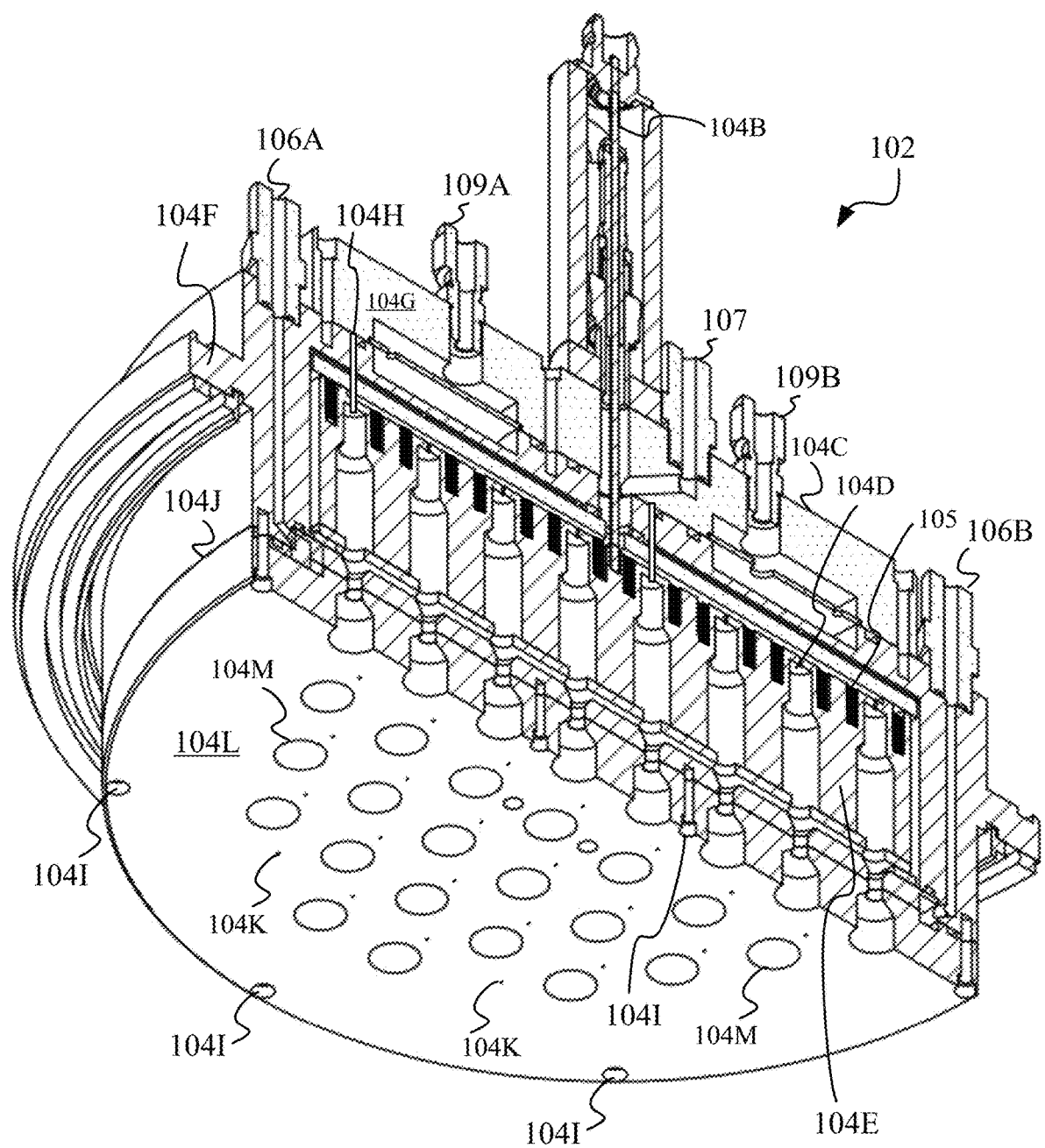
FIG. 5 is a left perspective view of the reactor shown in FIG. 3-4.

Before proceeding further, let us take a look at another view of top portion 102 shown in FIG. 4 of chamber 100 of FIG. 3 based on the instant design. Such a left perspective view from below is shown in FIG. 5. Not all the reference numerals from FIG. 4 are shown in FIG. 5 and not all the details are shown in order to avoid clutter. For example, only one pinhole 104H is shown marked in FIG. 5 and only two such pinholes are shown. There is a trap volume 104J shown in FIG. 4 and FIG. 5. Referring to FIG. 5 now, trap volume 104J is created by affixing a bottom component or "showerhead" 104L to the rest of housing/body 104F of our ECR-enhanced HCPS 104C. This affixing is preferably done via screws or bolts 104I shown in FIG. 4-5. Note, that not all such screws/bolts are shown or marked in FIG. 4-5 for clarity.

Trap volume 104J is a thin space created preferably via a spacer ring (not explicitly shown), between showerhead 104L and the rest of housing 104E when the two are screwed/bolted together. Of course, there are also one or more O-rings (not shown) outside of such a spacer ring in order to provide a pneumatic seal around trap volume 104J when showerhead 104L is screwed/bolted to body 104F. Connected to trap volume 104J are the egresses of process gas inputs 106A-B of above explanation. As reactant gases are flowed through gas inputs 106A-B, they arrive in trap volume 104J from where they seep/inject into the process volume via these egresses or pinholes 104K. Recall while briefly referring to FIG. 3 and prior explanation, the process volume is formed below the showerhead once top portion 102 of chamber assembly is connected and sealed with bottom portion 120. Wafer 140 resides atop a heated and rotating platen in the process volume per above explanation.

Now, referring again to FIG. 4-5, plasma is also transmitted or passed from hollow cathode cavities 104D down to the process volume via output holes 104M located on the bottom of showerhead 104L. Explained further, in trap volume 104J there are mating interfaces to the exits of hollow cathodes/cavities 104D as shown, that allow the plasma to pass or transmit through to output holes 104M without seeping into trap volume 104J itself.

Explained even further, pinholes 104K are drilled into a trench or groove for the reactant gases, and gases move in the trench where their conductance is higher as compared to the mating interfaces of the plasma which are clamped and provide higher resistance to the gases to come close to the plasma. In this manner, the reactant gases in trap volume 104J do not come in contact with the plasma until both they and the plasma have reached the process volume via pinholes 104K and output holes 104M respectively. Note that not all holes 104K and 104M are shown marked by reference numerals in order to avoid clutter.

Figure 6:
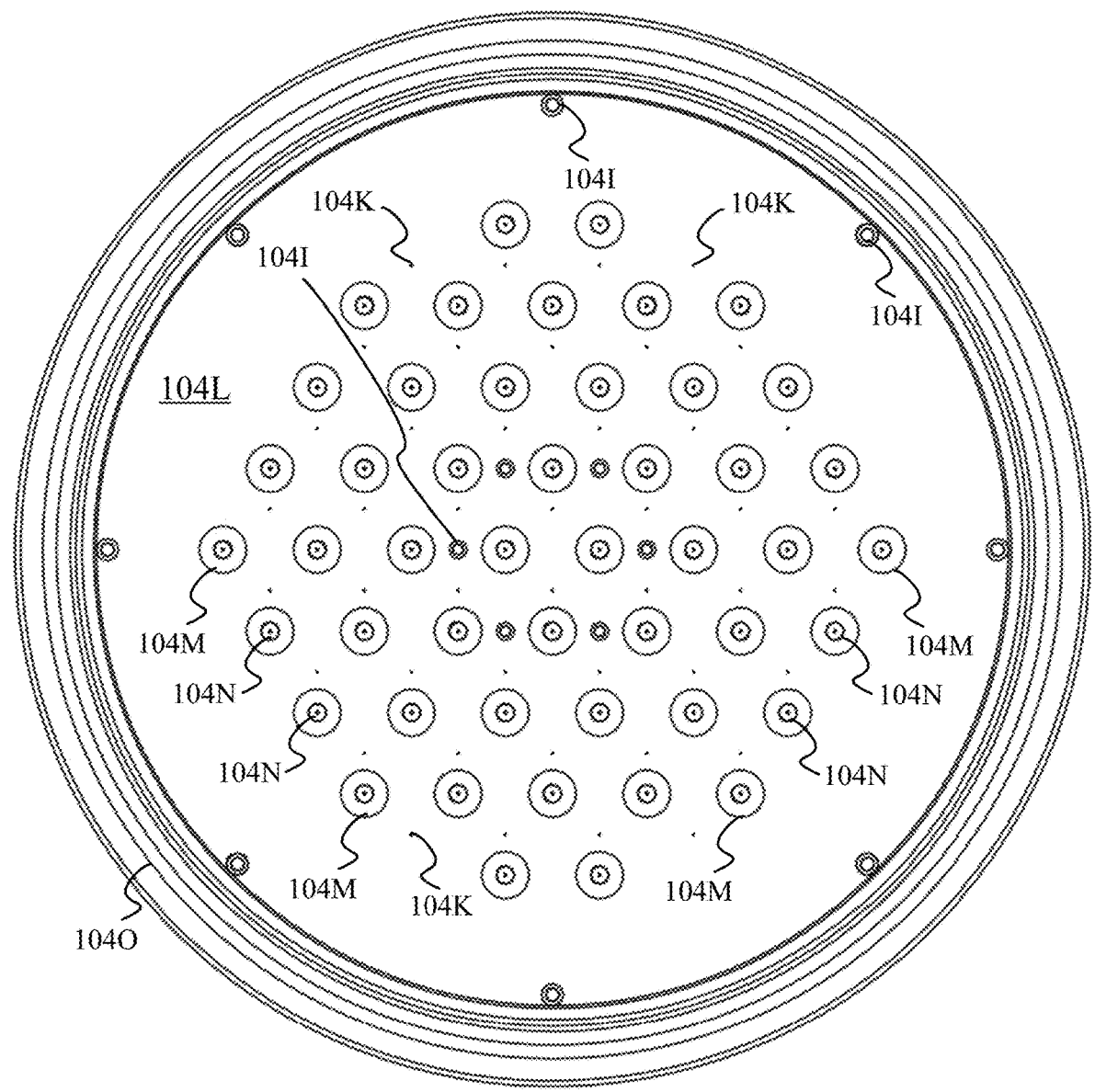
FIG. 6 shows a frontal view of the showerhead design of the reactor shown and discussed in reference to FIG. 3-5.

FIG. 6 shows a frontal view of our showerhead 104L of FIG. 5. It shows our bolts/screws 104I, output holes 104M and pinholes 104K. Also shown explicitly are exit holes 104N of hollow cathode cavities 104D of FIG. 4-5 as visible through output holes 104M. Again, not all of holes 104K, 104M and 104N are marked explicitly to avoid clutter. Also shown explicitly in FIG. 6 is O-ring 104O that is used to obtain the vacuum seal between top portion 102 and bottom portion 120 of chamber assembly 100, once the two are closed per above explanation.

The present design of ECR-enhanced HCPS with cylindrical and aligned magnets around each hollow cathode 104D, allows the plasma coming out of output holes 104M to be high-density, very stable/uniform, reproducible, and be possible under extremely low pressures. It also allows for minimal sputtering off the walls of cavities 104D. Let us now enumerate the various advantages of the present ECR-enhanced HCPS design over traditional art in further detail. These advantages are provided below:

1. Uniform, stable and reproducible plasma: The present multi-cavity ECR-enhanced HCPS embodiments taught in reference to FIG. 3-6 allow ionization of plasma gas and uniform generation of plasma in all cavities 104D per above teachings. The design thus allows for a very stable and reliable generation of plasma with a predictable and reproducible quality, as compared to the techniques of prior art.
2. Low pressures: In the present design, if Ar is used as the plasma gas, it is experimentally shown that once plasma is struck, it remains sustained down to 0.3 milli Torr at 200 W of RF-power in the embodiments taught in reference to FIG. 3-6. In contrast, traditional HCPS designs do not allow the plasma pressure to go below 0.1 Torr.
   Further, the present technology is compatible with low base pressure chambers where the pressure is of the order of $<10^{-7}$ Torr. Moreover, the pressure in the process volume based on the above design can be made to vary widely, i.e. from 0.3 millitorr to 2 Torr, based on the requirements of an application/recipe.
3. Reduced sputtering and loss of electrons: The present design significantly reduces material sputtering from the walls of hollow cathode cavity/cavities 58/104D of FIG. 2/FIG. 3-5 and thus reduces contamination. This is because electrons are confined to a narrow spiraling beam which draws ions away from the walls of the cavity/cavities per above teachings and thus reduced sputtering from the walls. It thus also reduces the loss of electrons to the walls of the cavity/cavities.
4. Stable load on RF-power: The present design also produces a well-defined load for the RF-power source preferably working in conjunction with an RF auto-tuner. Preferably, the RF-power source generates RF power of at least 100 W at a frequency of substantially or approximately 13.5 MHz. Since the plasma stays stable, the present design makes it easy for the RF auto-tuner to adapt to changing pressure in the cavity/cavities and to any power changes.
5. Scalable: The design can be easily scaled laterally by increasing the surface area of RF cathode 104E of FIG. 3-6 by introducing more cavities 104D. The surface can also be curved as needed. The power of the RF-power source can also be increased further since there is less heat dissipation in the present design. The less heat dissipation is due to reduced collisions of electrons and ions on the cavity walls and due to the cooling of the system with water per above innovative design. Recall from above teachings in reference to FIG. 4, that cylindrical, aligned magnets 105 are cooled as a result of thermally conducting/conductive ceramic plate 115, cooling plate 111 and water inlet/outlet ports 109A/109B.
6. Separation of plasma generation and process gas injection: Referring to the embodiments of FIG. 4-5, the present design enables separation of plasma generation in cavities 104D from the injection of process gas(es) from trap volume 104J through pinholes 104K into the process volume below showerhead 104L. Recall from above, that the plasma enters into the process volume via output holes 104M, and it is the process volume where the process gas(es) and the plasma first meet. If the process gas(es) are exposed to plasma generation prematurely, as in some prior art designs, process gas(es), such as silane (SiH4), can easily disassociate before reaching the process volume.
   In this manner, activation of one species of gas can be decoupled from the other. For example, nitrogen (N2) or ammonia (NH3) or an N2+Ar mixture or an NH3+Ar mixture, can be introduced via plasma gas feed 107, while the more delicate SiH4 can be introduced via gas inputs 106A-B. The two would subsequently be injected into the process volume via holes 104M and 104K respectively per above.
   Furthermore, while allowing a uniform injection of process gas(es) downstream of plasma generation, the above design thus enables an even/uniform gas distribution from showerhead 104L into the process volume per above.
7. Plasma enhanced/assisted atomic layer deposition (PEALD/PAALD): While the design of the embodiments in reference to FIG. 3-6 were discussed with special emphasis to PECVD, it must be noted that the same design is also suitable for PEALD or PA LD per the teachings of the above-referenced U.S. application Ser. No. 16/738,240 filed on Jan. 9, 2020 to Birol, and which are not repeated here to avoid repetition. The only difference is the use of the type of the plasma source being used. While the above-mentioned reference uses a planar inductively coupled plasma (ICP) source, the instant design of FIG. 3-6 uses our ECR-enhanced HCPS.

In this manner, the present embodiments of FIG. 3-6 can be used for continuous-flow PEALD or for non-continuous flow PEALD, while utilizing the instant ECR-enhanced HCPS 104C. As a result, deposition in the process volume can be accomplished one atomic layer at a time using the self-limiting ALD reactions of the reactants with the substrate or wafer, accruing all the benefits of such a PEALD technology as taught in the above-referenced patent application.

8. Atomic layer etching: Related to PEALD above, the design of the embodiments presented above is also suitable for atomic layer etching (ALE). In the case of ALE, a sequence of alternating steps of self-limiting chemical modification and etching of chemically-modified areas is performed. These steps affect only the top atomic layers of the wafer and allow the removal of individual atomic layers one at a time. ALE is a better-controlled process than reactive ion etching (RIE). A typical example is the etching of silicon by alternating reactions with Chlorine for modification and Argon ions for etching.

The above ALE process can be achieved by the instant design of FIG. 3-6 utilizing our ECR-enhanced HCPS 104C, if Chorine is introduced via gas feeds 106A-B for attaching to impurities and exemplarily Argon is used as the plasma gas. The plasma gas is introduced sequentially from gas input 107 programmatically via process computer 112. Chlorine with the attached contaminants is then removed from the process volume via one or more purge cycles. The present design thus allows for etching to take place gently at very low temperatures.

In other words, the design does not require the platen heater to heat the substrate at high temperatures to facilitate reaction, but instead to only low temperatures where etching is finely controlled. Furthermore, the ion energies can be dialed down as desired. This is easily accomplished by reducing the power of the RF-power source, so that the high-density plasma is generated at low energy levels. Exemplarily, the high-density plasma has a density of ($10^{11}$-$10^{12}$ ions/cc) with low electron temperatures of 1-2 eV in the process volume. As a result, the ion flux to the platen/plate holding the substrate also has low energy, since ions are accelerated in a potential difference of plasma potential minus plate potential (<100V).

In the prevailing art, the widespread use of ALE has been hampered because of low throughput due to the requirement of sophisticated gas handling. This is chiefly due to the requirement of moving the substrate after cleaning to another chamber, thereby reducing the throughput and increasing the overall cost of the operation. Furthermore, the traditional techniques thus subject the wafer to recontamination.

The present design solves the above problem by efficiently switching between various gases for ALE and ALD modes of operation without requiring slow and expensive mechanical interventions. As an example, purely by computer-generated signals, one is able to seamlessly switch from Chlorine to Argon in the process volume. This is done programmatically by opening/closing of the various gas feedthroughs of the equipment explained above, allowing for ALE gases to reach the volume for modification/etching, on any requisite carrier gases.

9. Biasing for controlling ion energies: As per the teachings of the above-referenced U.S. application Ser. No. 16/738,240 filed on Jan. 9, 2020 to Birol, the platen holding the substrate/wafer in the process volume can be RF-biased for better controlling ion energies. The RF-bias may be provided from a separate RF port from below the chamber assembly.

Recall from the teachings of the above reference that the RF-bias on the platen is beneficial for the heavier ions of PECVD layers by inducing ion beam annealing. This allows a practitioner to have a very fine-grained control over the PECVD layers being deposited and thus better manage its density and stress. As a result, the practitioner is able to avoid cracking, compression, stretching, etc. of the PECVD layers.

Per above, by controlling the RF-bias to the platen, the present design thus allows for keeping plasma temperature low, while allowing ion energies to be dialed higher or lower depending on the needs of an application/recipe.

Figure 7:
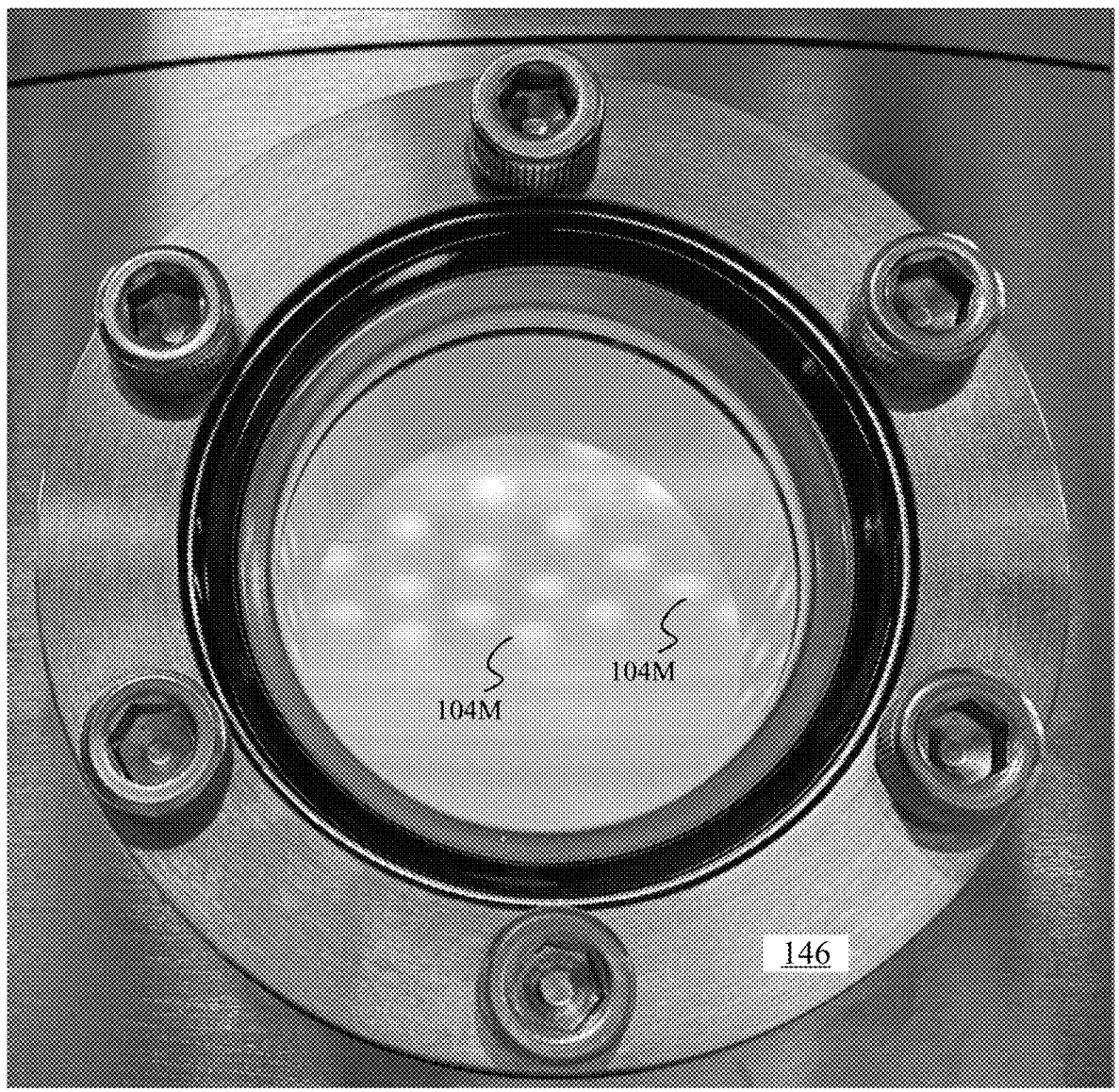
FIG. 7 is a photograph from a viewport of the reactors of FIG. 3-6 showing the uniformly lit instant ECR-enhanced HCPS cavities only possible with the present technology.

For completeness, FIG. 7 shows a photograph from viewport 146 explained in reference to FIG. 3. Specifically, the photograph displays output holes 104M showing that all instant hollow cathodes/cavities 104D discussed in reference to FIG. 4-6 are lit up by plasma uniformly. Note that only two output holes 104M are shown marked by reference numerals to avoid clutter. The uniform brightness of the cavities is a testament to the uniform and stable quality of high-density plasma possible by the present ECR-enhanced HCPS design.

ECR-Enhanced HCPS Parameters and Calculations Based on Instant Principles

Now let us consider the operating parameters of some preferred embodiments of our ECH-enhanced HCPS design and perform downstream calculations.

If $r_c$ is the radius of the rotation of free electrons under electron cyclotron rotation (ECR) in cavities 58 and 104D of FIG. 2 and FIG. 4-5 respectively, v is the velocity of electrons and co is their angular frequency, then:

$$r_c = v/\omega \qquad \text{Eq. 1}$$

In Eq. (1) above, $\omega = 2\pi 2.8B$ and $v = 3.9 \ 10^3 \ T^{1/2}$ m/sec, given B is in Gauss and T is in ° K, and $r_c$ is generally referred to as the cyclotron radius by those skilled in the art.

If we set T~11500° K, for a typical 1 ev or $1.15 \times 10^4$ Kelvin electrons in a 13,200 Gauss magnetic field, such as magnetic field 54 of magnet 52 of FIG. 2 or the magnetic fields of magnets 105 of FIG. 4-5, from Eq. (1) above we get: $r_c = 1.8$ micron. Therefore, the cyclotron radius/radii $r_c$ of free electrons in cavity 58 and cavities 104D<<Inner radius/radii of cavity/cavities 58/104D of FIG. 2 and FIG. 4-5 respectively. In other words, the instant arrangement keeps newly created free electrons confined to a narrow spiraling beam, and thus prevents their loss to the walls of the cavity/cavities at lower pressures. Furthermore, magnetic field enhances ionization or production of plasma in all hollow cathode cavities and confines the ions away from walls to maintain neutrality, thereby minimizing sputtering.

Referring to FIG. 4-6, preferably, pinholes 104H are 0.03 inches in diameter. Preferably, the neck of hollow cathode cavities 104D is 0.3 inches in length. Preferably, the length of the bodies of cavities 104D is 1 inch. Preferably, magnets 105 (as well as magnet 52 of FIG. 2) are Neodymium magnets. Preferably still, magnets 105 are RC48 Neodymium magnets. Preferably, the diameter of pinholes 104K is 0.02 inches. Preferably, the number of such pinholes 104K is 44. Preferably, the least distance between any two such pinholes 104K is 1 inch. Preferably, the diameter of output holes 104M is 0.5 inches. Preferably, the number of such output holes 104M is 48.

In view of the above teaching, a person skilled in the art will recognize that the apparatus and methods of invention can be embodied in many different ways in addition to those described without departing from the principles of the invention. Therefore, the scope of the invention should be judged in view of the appended claims and their legal equivalents.

What is claimed is:

1. A hollow cathode plasma source (HCPS) comprising:
   (a) one or more cylindrical and aligned magnets around each of corresponding one or more hollow cathodes;
   (b) a gas flown through a neck of said each of corresponding one or more hollow cathodes;
   (c) a radio frequency (RF) field present around said each of corresponding one or more hollow cathodes, said RF field causing said gas to undergo a phase transition to a plasma containing free electrons and gas ions;
   (d) said free electrons traveling in a spiraling beam down a body of said each of corresponding one or more hollow cathodes; and
   (e) said spiraling beam confined by electron cyclotron rotation (ECR) caused by each of said one or more cylindrical and aligned magnets;
   wherein said plasma is produced at a distal end of said each of corresponding one or more hollow cathodes.

2. The HCPS of claim 1, wherein a frequency of said RF field is substantially 13.56 Megahertz (MHz).

3. The HCPS of claim 1, wherein each of corresponding one or more hollow cathodes is bottle-shaped.

4. The HCPS of claim 1, wherein a cyclotron radius of said free electrons in said each of corresponding one or more hollow cathodes is approximately 1.8 microns.

5. The HCPS of claim 1, wherein said distal end of said each of corresponding one or more hollow cathodes transmits said plasma through a corresponding output hole located on a bottom of a showerhead placed above a process volume.

6. The HCPS of claim 5, wherein said one or more cylindrical and aligned magnets are cooled by an arrangement comprising a thermally conducting ceramic plate, a cooling plate and water.

7. The HCPS of claim 6, wherein said showerhead also contains pinholes for injecting one or more process gases in said process volume.

8. The HCPS of claim 7, wherein said process volume is used for depositing one or more plasma enhanced chemical vapor deposition (PECVD) films on a substrate located below said showerhead.

9. The HCPS of claim 7, wherein said process volume is used for depositing one or more atomically sized plasma enhanced atomic layer deposition (PEALD) films on a substrate located below said showerhead.

10. The HCPS of claim 7, wherein said process volume is used for performing atomic layer etching (ALE) on a substrate located below said showerhead.

11. A method comprising the steps of:
    (a) placing one or more cylindrical and aligned magnets around each of corresponding one or more hollow cathodes;
    (b) flowing a gas through a neck of said each of corresponding one or more hollow cathodes;
    (c) producing a radio frequency (RF) field around said each of corresponding one or more hollow cathodes, said RF field causing said gas to undergo a phase transition to a plasma containing free electrons and gas ions;
    (d) said free electrons traveling in a spiraling beam down a body of said each of corresponding one or more hollow cathodes;
    (e) confining said spiraling beam by electron cyclotron rotation (ECR) caused by each of said one or more cylindrical and aligned magnets; and
    (f) producing said plasma at a distal end of said each of corresponding one or more hollow cathodes.

12. The method of claim 11, establishing said RF field at a frequency of substantially 13.56 Megahertz (MHz).

13. The method of claim 11, providing said each of corresponding one or more hollow cathodes to be bottle-shaped.

14. The method of claim 11, providing a cyclotron radius of said free electrons in said each of corresponding one or more hollow cathodes to be approximately 1.8 microns.

15. The method of claim 11, transmitting said plasma from said distal end of said each of corresponding one or more hollow cathodes through a corresponding output hole located on a bottom of a showerhead placed above a process volume.

16. The method of claim 15, cooling said one or more cylindrical and aligned magnets by an arrangement containing a thermally conductive ceramic plate, a cooling plate and water.

17. The method of claim 15, further providing pinholes in said showerhead for injecting one or more process gases in said process volume from a trap volume.

18. The method of claim 17, depositing one or more plasma enhanced chemical vapor deposition (PECVD) films on a substrate located in said process volume below said showerhead.

19. The method of claim 17, depositing one or more atomically sized plasma enhanced atomic layer deposition (PEALD) films on a substrate located in said process volume below said showerhead.

20. The method of claim 17, performing atomic layer etching (ALE) on a substrate located in said process volume below said showerhead.

* * * * *